United States Patent [19]
Osawa et al.

[11] Patent Number: 5,960,008
[45] Date of Patent: Sep. 28, 1999

[54] TEST CIRCUIT

[75] Inventors: Tokuya Osawa; Hideshi Maeno, both of Tokyo, Japan

[73] Assignee: Mitsubishi Denki Kabushiki Kaisha, Tokyo, Japan

[21] Appl. No.: 08/768,124

[22] Filed: Dec. 17, 1996

[30] Foreign Application Priority Data

Aug. 30, 1996 [JP] Japan .................................. 8-229873

[51] Int. Cl.$^6$ .................................................. G01R 31/28
[52] U.S. Cl. ........................................ 371/22.31; 365/201
[58] Field of Search ............................. 371/22.31, 22.32, 371/22.34, 22.5, 27.1, 21.1, 22.6; 395/183.06, 183.18; 365/201, 189.62, 189.63; 364/489, 490; 324/765

[56] References Cited

U.S. PATENT DOCUMENTS

| | | | |
|---|---|---|---|
| 5,257,267 | 10/1993 | Ishizaka | 371/22.3 |
| 5,459,736 | 10/1995 | Nakamura | 371/22.3 |
| 5,477,493 | 12/1995 | Danbayashi | 365/201 |
| 5,495,487 | 2/1996 | Whetsel, Jr. | 371/25.1 |
| 5,546,406 | 8/1996 | Gillenwater et al. | 371/22.5 |
| 5,570,375 | 10/1996 | Tsai et al. | 371/22.3 |
| 5,588,006 | 12/1996 | Nozuyama | 371/3 |
| 5,617,428 | 4/1997 | Andoh | 371/22.3 |
| 5,621,740 | 4/1997 | Kamada | 371/22.3 |
| 5,726,998 | 3/1998 | Ozaki | 371/22.31 |
| 5,729,553 | 3/1998 | Motohara | 371/22.5 |

FOREIGN PATENT DOCUMENTS

| | | |
|---|---|---|
| 60-147659 | 8/1985 | Japan . |
| 60-231187 | 11/1985 | Japan . |
| 1-110274 | 4/1989 | Japan . |
| 6-90265 | 11/1994 | Japan . |
| 8-94718 | 4/1996 | Japan . |

*Primary Examiner*—Robert W. Beausoliel, Jr.
*Assistant Examiner*—Nadeem Iqbal
*Attorney, Agent, or Firm*—Burns, Doane, Swecker & Mathis, LLP

[57] ABSTRACT

In a normal operation, a shift mode signal (SM) is set to "0" to propagate signals applied to "0"-input ends of selectors (10 to 12), i.e., outputs of a logic unit (80). In a logic scan test on logic units (80, 81), by setting a test-mode signal to "1", an ordinary scan test is performed with a scan path of simple configuration, having bits as much as write data and employing scan flip flops consisting of pairs of selectors (10 to 12) and flip flops (30 to 32) respectively. The flip flops used for writing in the normal operation can be also used as those used for the scan flip flops in the logic test. Thus, a configuration of the scan path to achieve excellent area-efficiency is provided.

15 Claims, 14 Drawing Sheets

TEST CIRCUIT

BACKGROUND OF THE INVENTION

1. Field of the Invention

The present invention relates to a scan path, and more particularly to a scan path provided in the periphery of an asynchronous RAM core.

2. Description of the Background Art

FIG. 20 is a block diagram showing a test method on a RAM which has been often used in a background art. A scan test is used as the test method.

Flip flops (represented as "FF" in figures) provided inside a semiconductor chip are replaced by scan flip flops (represented as "SFF" in figures) and the scan flip flops constitute a scan path. In FIG. 20, for example, logic units 80 and 81 and a RAM core 91 which is an asynchronous RAM are surrounded by the same scan path. The scan path receives test data in a form of scan-in signal SI which is a serial signal and outputs a test result in a form of scan-out signal SO which is a serial signal after test execution.

In FIG. 20, scan flip flops are provided both on the input and output sides of the asynchronous RAM core 91. The device including the RAM core 91 and the scan flip flops on the whole performs reading/writing operations as a synchronous (complete synchronous) RAM 92. When a scan test is performed, the test data and test result are propagated on the scan path constituted of the scan flip flops.

FIG. 21 is a circuit diagram showing a configuration of the scan path in the periphery of the RAM 91 in detail. Each of the scan flip flops consists of a pair of a selector which switches the input in response to a shift mode signal SM and a flip flop. Storing/reading operations of an output (test result) of the logic unit 80 are performed by the scan flip flops each consisting of a pair of a selector 10 and a flip flop 30, a pair of a selector 11 and a flip flop 31 or a pair of a selector 12 and a flip flop 32, all of which are disposed on the input side of the RAM 91. Storing/reading operations of an input (test pattern) of the logic unit 81 are performed by the scan flip flops each consisting of a pair of a selector 20 and a flip flop 40, a pair of a selector 21 and a flip flop 41 or a pair of a selector 22 and a flip flop 42, all of which are disposed on the output side of the RAM 91.

Selectors 50 to 52 selectively output either respective outputs of the flip flops 40 to 42 disposed on the output side or outputs of the RAM core 91. In execution of the scan test, a test-mode signal TEST is set to "1", and in a normal operation, it is set to either "1" or "0". In the execution of the scan test, the RAM 92 performs both the reading and writing operations in a synchronous mode. On the other hand, in the normal operation, the RAM 92 performs the reading operation in an asynchronous mode and the writing operation in a synchronous mode.

In the configuration of FIG. 21, when the RAM 92 performs the reading operation in the asynchronous mode (the test-mode signal TEST is "0"), the flip flops 40 to 42 disposed on the output side are used only during the test. That raises a problem of poor area-efficiency (area overhead).

SUMMARY OF THE INVENTION

The present invention is directed to a test circuit provided between first and second circuits for performing a first test on the first and second circuits. According to a first aspect of the present invention, the test circuit comprises: (a) a third circuit having a group of input ends connected to the first circuit and a group of output ends; (b) a scan path having a group of input ends connected to the first circuit, a group of output ends connected to the group of input ends of the third circuit, a scan input terminal and a scan output terminal, for propagating a scan signal between the scan input terminal and the scan output terminal; and (c) first selecting means for selectively connecting either the group of output ends of the third circuit or the group of output ends of the scan path to the second circuit.

According to a second aspect of the present invention, the test circuit of the first aspect further comprises: (d) second selecting means for selectively outputting either signals applied to the group of output ends of the scan path or test data which are received in execution of a second test on the third circuit to the third circuit.

According to a third aspect of the present invention, in the test circuit of the second aspect, the scan path consists of (b-1) a plurality of scan flip flops, each having a first input terminal connected to the first circuit, being a constituent of the group of input ends of the scan path; a second input terminal to which the scan signal is propagated; a third input terminal for receiving an output of the third circuit; and an output terminal being a constituent of the group of output ends of the scan path, and each selectively holding one of data applied to the first to third input terminals and outputting the one of data to the output terminal.

According to a fourth aspect of the present invention, in the test circuit of the second aspect, the scan path includes (b-1) a plurality of scan flip flops, each having a first input terminal connected to the first circuit, being a constituent of the group of input ends of the scan path; a second input terminal; and an output terminal being a constituent of the group of output ends of the scan path, and each selectively holding one of data applied to the first and second input terminals and outputting the one of data to the output terminal; (b-2) a logic circuit for receiving an output of the third circuit and the scan signal. In the test circuit of the fourth aspect, the logic circuit propagates the scan signal to the second input terminal of each of the plurality of scan flip flops in a first case, and the logic circuit and the plurality of scan flip flops constitute a MISR circuit to process the output of the third circuit in a second case.

According to a fifth aspect of the present invention, in the test circuit of the second aspect, the scan path includes (b-1) a plurality of scan flip flops, each having a first input terminal connected to the first circuit, being a constituent of the group of input ends of the scan path; a second input terminal to which the scan signal is propagated; and an output terminal being a constituent of the group of output ends of the scan path, and each selectively holding one of data applied to the first and second input terminals and outputting the one of data to the output terminal; (b-2) first selectors provided correspondingly to the plurality of scan flip flops, each having an output end connected to the second input terminal, a first input end and a second input end which are selectively connected to the output end of each of the first selectors; and (b-3) logic circuits provided correspondingly to the plurality of scan flip flops, each receiving an output of the third circuit and outputting the output of the third circuit to the second input end of each of the first selectors. In the test circuit of the fifth aspect, the scan signal is propagated to the first input end of each of the first selectors, and each of the logic circuits and each of the first selectors form a loop to hold an output of the corresponding one of the plurality of scan flip flops and give a predetermined logic to the corresponding one of the plurality of scan flip flops if a result of the second test is faulty.

According to a sixth aspect of the present invention, in the test circuit of the first aspect, a first number of output ends constituting the group of output ends of the third circuit is larger than a second number of input ends constituting the group of input ends of the third circuit, the first selecting means consists of selectors provided correspondingly to the output ends of the third circuit, and a plurality of the selectors are connected to one of output ends constituting the group of output ends of the scan path.

According to a seventh aspect of the present invention, in the test circuit of the sixth aspect, the output ends of the third circuit are allocated to a plurality of groups, the output ends of the scan path are also allocated to a plurality of groups, and a plurality of the output ends of the third circuit allocated to one of the plurality of groups are connected to one of the output ends of the scan path corresponding to the one of the plurality of groups.

In the test circuit of the first aspect, when the first selecting means selectively connects the group of output ends of the third circuit to the second circuit, the input operation of the third circuit is performed in a synchronous mode and the output operations of the third circuit is performed in an asynchronous mode. On the other hand, when the first selecting means selectively connects the group of output ends of the scan path to the second circuit, a logic scan test is performed on the first and second circuits. Since the test circuit of the first aspect uses the same scan flip flops in both cases, the test circuit can perform the two types of operations while suppressing an area overhead.

In the test circuit of the second aspect, when the second selecting means outputs the signal applied to the group of output ends of the scan path to the third circuit, the configuration of the test circuit of the first aspect can be achieved. On the other hand, when the second selecting means outputs the test data to the third circuit, the second test can be performed.

In the test circuit of the third aspect, when the second selecting means outputs the test data to the third circuit to perform the second test, the flip flops, which are used for input operation of the third circuit in the normal operation, perform the function of scanning and outputting the test result of the second test outputted from the third circuit.

In the test circuit of the fourth aspect, since the MISR circuit is made when the second test is performed, a test result in a compressed form can be obtained.

In the test circuit of the fifth aspect, once a fault is found in the second test result, a predetermined logic is fixed to the flip flop for each of the output ends of the third circuit by the logic circuit, and the fault is thereby memorized. Thus, the compressed test result can be obtained.

The test circuit of the sixth aspect can produce the same effect as that of the second aspect on the third circuit in which the number of input ends is smaller than the number of output ends.

In the test circuit of the seventh aspect, a plurality of test data which are independent of one another can be given to the second circuit since the output ends of the third circuit allocated to groups are connected to the different output ends of the scan path on a group-by-group basis.

An object of the present invention is to provide a configuration of a scan path to achieve an excellent area-efficiency.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment.

Figure 1:
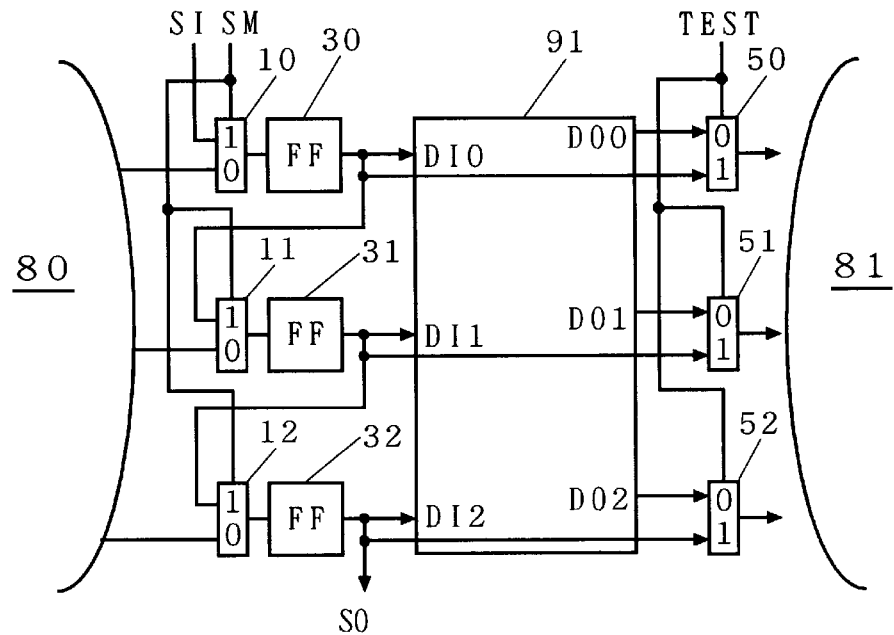
FIG. 1 is a circuit diagram showing a first preferred embodiment of the present invention.

FIG. 1 is a circuit diagram of the first preferred embodiment of the present invention. An output of the logic unit 80 is given to the first input ends of the selectors 10, 11 and 12. The scan-in signal SI is applied to the second input end of the selector 10 and an output end of the selector 10 is connected to an input end of the flip flop 30. The second input end of the selector 11 is connected to an output end of the flip flop 30 and an output end of the selector 11 is connected to an input end of the flip flop 31. The second input end of the selector 12 is connected to an output end of the flip flop 31 and an output end of the selector 12 is connected to an input end of the flip flop 32. An output end of the flip flop 32 outputs the scan-out signal SO. The selectors 10 to 12 pair with the flip flops 30 to 32, respectively, and each pair constitutes a scan flip flop.

The shift mode signal SM is applied to all of the selectors 10 to 12 and each of the selectors 10 to 12 outputs a signal applied to either of the first and second input ends thereof in response to the value "0" or "1" of the shift mode signal SM. In each of the selectors, hereinafter, one of the input ends which receives a signal to be propagated to the output end when the signal for controlling the operation of the selector is "0" is referred to as "0"-input end, and the other input end which receives a signal to be propagated to the output end when the signal for controlling the operation of the selector is "1" is referred to as "1"-input end.

Input ends D10 to D12 of the RAM core 91 are connected to the output ends of the flip flops 30 to 32, respectively. Output ends DO0 to DO2 of the RAM core 91 are connected to "0"-input ends of the selectors 50 to 52, respectively. The output ends of the flip flops 30 to 32 are connected to the "1"-input ends of the selectors 50 to 52, respectively. The output ends of the selectors 50 to 52 are connected to the logic unit 81. The operations of the selectors 50 to 52 are controlled by the test-mode signal TEST which is applied to all of the selectors 50 to 52.

Table 1 shows the relation between the signals in FIG. 1 and operation modes.

TABLE 1

|  | NORMAL OPERATION | LOGIC SCAN TEST | |
| --- | --- | --- | --- |
|  |  | SCAN | TEST |
| SI | DC | TEST DATA | DC |
| TEST | 0 | 1 | 1 |
| SM | 0 | 1 | 0 |

DC: Don't Care

In the normal operation, since the shift mode signal SM is "0", the signals applied to the "0"-input ends of the selectors 10 to 12, i.e., the outputs of the logic unit 80, are propagated to the flip flops 30 to 32. Accordingly, the signal travelling through the "1"-input ends of the selectors 10 to 12, i.e., the scan-in signal SI, may take any value (Don't care). Further, since the test-mode signal TEST is set to "0", the signals from the output ends of the RAM core 91 are propagated to the logic unit 81.

Figure 2:
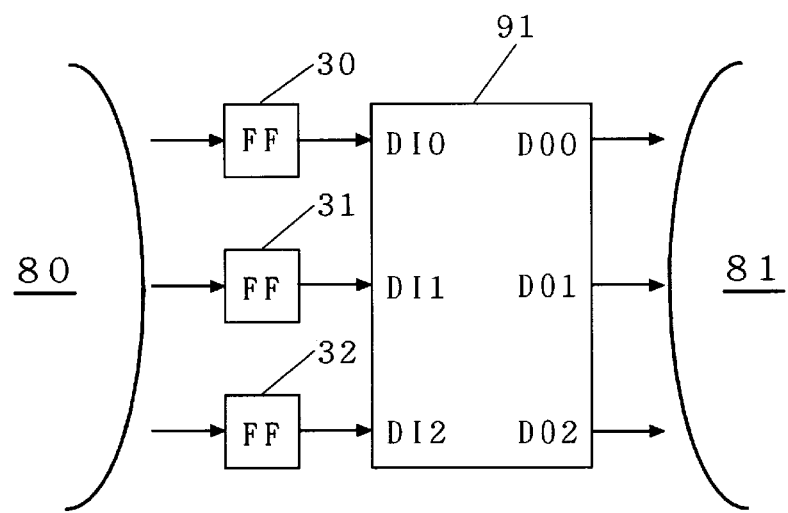
FIG. 2 is a circuit diagram showing an equivalent configuration of the circuit of FIG. 1 in a normal operation.

FIG. 2 is a circuit diagram showing an equivalent configuration of the circuit of FIG. 1 in the normal operation. The outputs of the logic unit 80 are inputted to the RAM core 91 through the flip flops 30 to 32 and the outputs of the RAM core 91 are given to the logic unit 81. Thus, the circuit of FIG. 1 performs a synchronous writing and an asynchronous reading in the normal operation.

Figure 3:
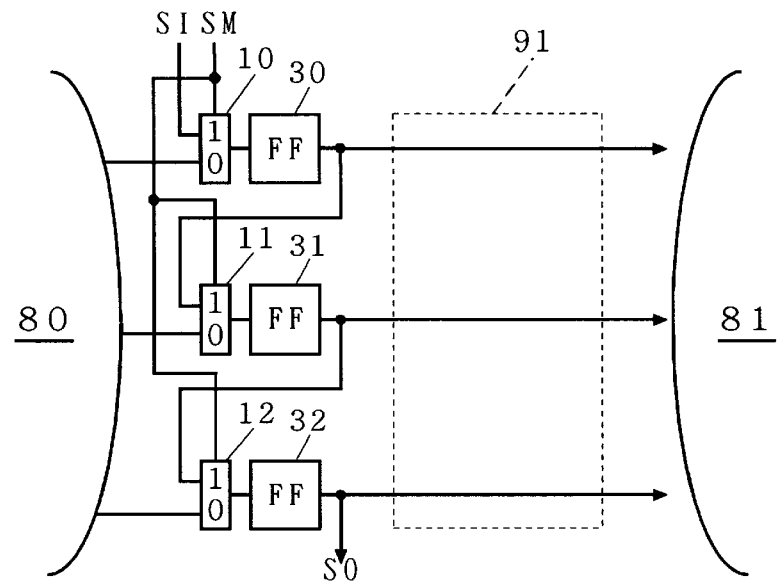
FIG. 3 is a circuit diagram showing an equivalent configuration of the circuit of FIG. 1 in a logic scan test.

FIG. 3 is a circuit diagram showing an equivalent configuration of the circuit of FIG. 1 in the logic scan test. In execution of the logic scan test on the logic units 80 and 81, the test-mode signal is set to "1". Since the signals applied to the "1"-input ends of the selectors 50 to 52 are propagated to the logic unit 81, the outputs of the flip flops 30 to 32 are inputted to the logic unit 81. Therefore, the outputs of the RAM core 91 which are applied to the "0"-input ends of the selectors 50 to 52 are not related to the logic scan test. Accordingly, the outputs of the logic unit 80 are given to the logic unit 81 through the flip flops 30 to 32.

Thus, an ordinary scan test can be performed by using the scan path of simple configuration, having bits as much as write data and employing the scan flip flops constituted of respective pairs of the selectors 10 to 12 and the flip flops 30 to 32. First, test data are inputted as the scan-in signal SI and the shift mode signal SM is set to "1" (see the column of "SCAN" of Table 1). The test data are thereby stored in the flip flops 30 to 32. After that, the shift mode signal SM is set to "0" (see the column of "TEST" of Table 1). The outputs of the logic unit 80 are thereby stored in the flip flops 30 to 32 and the test data are inputted to the logic unit 81. In this test mode, the scan-in signal SI to be applied to the "1"-input end of the selector 10 may take any value.

As discussed above, according to the first preferred embodiment, the flip flop used for writing in the normal operation may be also used as the flip flop to be a constituent of the scan flip flop for the logic test. Accordingly, the scan path (consisting of the selectors 20 to 22 and the flip flops 40 to 42) connected to a reading port in the background art is not needed, suppressing the area overhead. Moreover, since the scan path is disposed on the input side of the RAM core 91, the number of stages of data shifting is reduced, thereby cutting the test time.

The Second Preferred Embodiment.

According to the second preferred embodiment, two types of selectors are additionally provided to the circuit of the first preferred embodiment in order to implement a test mode on the RAM core 91.

Figure 4:
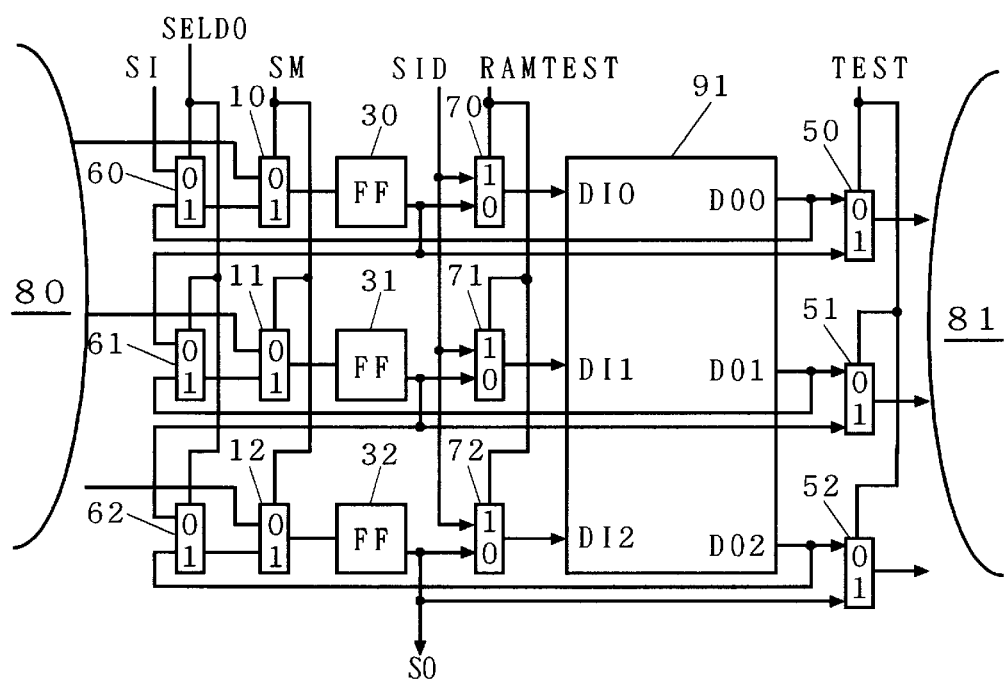
FIG. 4 is a circuit diagram showing a second preferred embodiment of the present invention.

FIG. 4 is a circuit diagram showing the second preferred embodiment of the present invention. The first type of selector includes selectors 60 to 62 provided between the logic unit 80 and the selectors 10 to 12. The second type of selector includes selectors 70 to 72 provided between the flip flops 30 to 32 and the RAM core 91.

The operations of the selectors 60 to 62 are controlled by an output selection signal SELDO. The operations of the selectors 70 to 72 are controlled by a RAM test signal RAMTEST.

Outputs of the selectors 60 to 62 are given to the "1"-input ends of the selectors 10 to 12, respectively. The output end of the flip flop 30 is connected to a "0"-input end of the selector 61 and indirectly connected to the "1"-input end of the selector 11 through the "0"-input end of the selector 61. The output end of the flip flop 31 is connected to a "0"-input end of the selector 62, instead of the "1"-input end of the selector 12. The scan-in signal SI is applied to a "0"-input end of the selector 60, instead of the "1"-input end of the selector 10. The output ends DO0 to DO2 of the RAM core 91 are connected to "1"-input ends of the selectors 60 to 62, respectively.

Output ends of the selectors 70 to 72 are connected to the input ends DI0 to DI2 of the RAM core 91, respectively. The output ends of the flip flops 30 to 32 are connected to "0"-input ends of the selectors 70 to 72, respectively, and indirectly connected to the input ends DI0 to DI2 of the RAM core 91 through the "0"-input ends of the selectors 70 to 72. RAM test data SID are given to "1"-input ends of the selectors 70 to 72.

The RAM test data SID and the output selection signal SELDO effectively perform their functions only in the RAM test, and are supplied by an external tester or a built-in RAM self-test circuit in the execution of the RAM test.

Table 2 shows the relation between the signals in FIG. 4 and the operation modes.

TABLE 2

|  | NORMAL OPERATION | RAM TEST | | |
|---|---|---|---|---|
|  |  | LOGIC SCAN TEST | TEST EXECUTION | RESULT OUTPUT |
| SI | DC | SCAN: TEST DATA TEST: DC | DC | DC |
| TEST | 0 | 1 | DC | DC |
| SM | 0 | SCAN: 1 TEST: 0 | 1 | 1 |
| RAMTEST | 0 | 0 | 1 | 1 |
| SELDO | 0 | 0 | 1 | 0 |
| SID | DC | DC | WRITE DATA | DC |

DC: Don't Care

In the normal operation and the logic scan test, both the RAM test signal RAMTEST and the output selection signal SELDO are set to "0". Then, the equivalent configuration of the circuit of FIG. 4 can be shown in FIG. 1. In other words, the circuit of FIG. 4 performs the same operation as in the first preferred embodiment.

Figure 5:
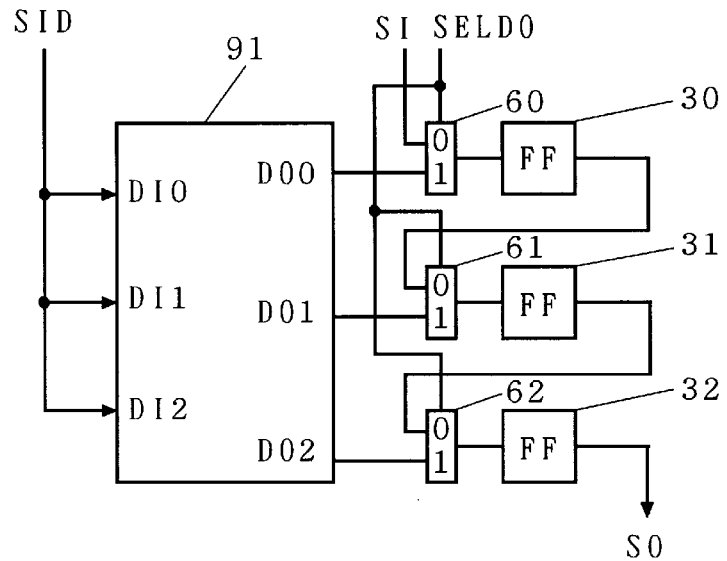
FIG. 5 is a circuit diagram showing an equivalent configuration of the circuit of FIG. 4 in a RAM test.

FIG. 5 is a circuit diagram showing an equivalent configuration of the circuit of FIG. 4 in the RAM test. When the RAM test is made, both the shift mode signal SM and the RAM test signal RAMTEST are set to "1". The test-mode signal TEST may take either "0" or "1". Since the selectors 50 to 52 are not related in function to the RAM test, the connections of the selectors 50 to 52 are omitted in FIG. 5.

The selectors 70 to 72 give the RAM test data SID which are applied to their "0"-input ends to the input ends DI0 to DI2 of the RAM core 91, respectively, and the selectors 10 to 12 give the outputs of the selectors 60 to 62 which are applied to their "1"-input ends to the flip flops 30 to 32, respectively.

Therefore, the flip flops 30 to 32, which are used for writing data into the RAM core 91 in the normal operation, receive the outputs of the RAM core 91 and scan and output the test result read out from the RAM core 91 in the RAM test.

A specific process of the RAM test is as follows: ①The RAM test data SID (set to "0", for example) are written to all addresses. ②The data of the RAM core 91 are read out. At this time, the output selection signal SELDO is set to "1" and the read data are inputted to the flip flops 30 to 32. The operations until this step are shown in the column of "TEST EXECUTION" of Table 2. ③The output selection signal SELDO is set to "0" to obtain the test result, i.e., the values stored in the flip flops 30 to 32, being shifted in sequence, as the scan-out signal SO, (see the column of "RESULT OUTPUT" of Table 2).

Since the area required for the selectors is smaller than that for the flip flops, the effect of suppressing the area overhead is attained even if two types of selectors are additionally provided as compared with the first preferred embodiment. Naturally, reduction in the number of shift-stages of the scan path allows a substantial cut in time for the RAM test, as well as time for the logic test, as compared with the conventional scan test.

The Third Preferred Embodiment.

According to the third preferred embodiment, the circuit can perform the test on the RAM core 91, like the second preferred embodiment. In particular, the third preferred embodiment features compression of data read out to the flip flops 30 to 32.

Figure 6:
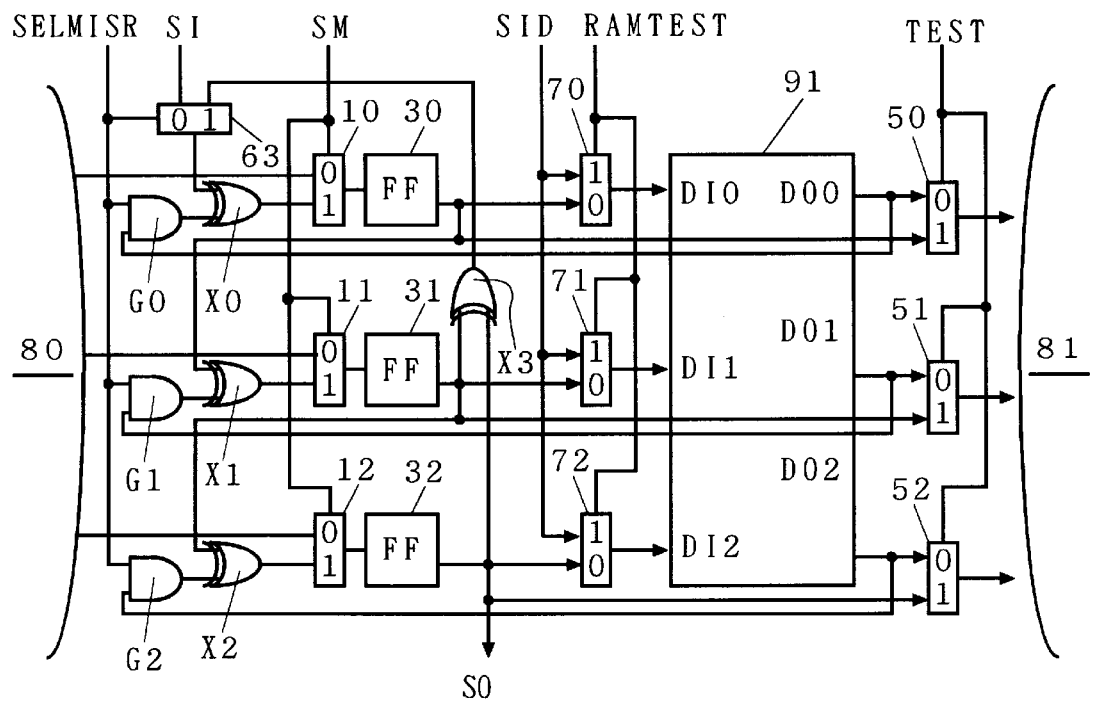
FIG. 6 is a circuit diagram showing a third preferred embodiment of the present invention.

FIG. 6 is a circuit diagram showing the third preferred embodiment of the present invention. The selectors 60, 61 and 62 of the second preferred embodiment are replaced by a pair of an AND gate G0 and an XOR gate X0, a pair of an AND gate G1 and an XOR gate X1 and a pair of an AND gate G2 and an XOR gate X2, respectively, and an XOR gate X3 and a selector 63 whose operation is controlled by a compression selection signal SELMISR are additionally provided.

The compression selection signal SELMISR is applied to one of the input ends of each of the AND gates G0 to G2. An output end of the AND gate G0 is connected to one of the input ends of the XOR gate X0, an output end of the AND gate G1 is connected to one of the input ends of the XOR gate X1 and an output end of the AND gate G2 is connected to one of the input ends of the XOR gate X2.

The output ends DO0 to DO2 of the RAM core 91 are connected to the other input ends of the AND gates G0 to G2, respectively, instead of the "1"-input ends of the selectors 60 to 62. The outputs of the flip flops 30 and 31 are given to the other input ends of the XOR gates X1 and X2, respectively, instead of the "0"-input ends of the selectors 61 and 62. An output of the selector 63 is given to the other input end of the XOR gate X0.

The scan-in signal SI is applied to a "0"-input end of the selector 63 and an output of the XOR gate X3 is given to a "1"-input end of the selector 63. The outputs of the flip flops 31 and 32 are given to the XOR gate X3.

The "1"-input ends of the selectors 10 to 12 receive outputs of the XOR gates X0 to X2, respectively, instead of the outputs of the selectors 60 to 62.

The RAM test data SID and the compression selection signal SELMISR effectively perform their functions only in the RAM test and are supplied by the external tester or the built-in RAM self-test circuit in the execution of the RAM test.

Table 3 shows the relation between the signals in FIG. 6 and the operation modes.

TABLE 3

|  | NORMAL OPERATION | LOGIC SCAN TEST | RAM TEST | |
|---|---|---|---|---|
|  |  |  | INITIALIZATION & RESULT OUTPUT | TEST EXECUTION |
| SI | DC | SCAN: TEST DATA TEST: DC | DC | DC |
| TEST | 0 | 1 | DC | DC |
| SM | 0 | SCAN: 1 TEST: 0 | 1 | 1 |
| RAMTEST | 0 | 0 | 1 | 1 |
| SELMISR | 0 | 0 | 0 | 0 → 1 |
| SID | DC | DC | DC | WRITE DATA |

DC: Don't Care

In the normal operation and the logic scan test, both the RAM test signal RAMTEST and the compression selection signal SELMISR are set to "0". The selectors 70 to 72 thereby give the outputs of the flip flops 30 to 32 to the input ends DI0 to DI2 of the RAM core 91, respectively, and the selector 63 gives the scan-in signal SI to the XOR gate X0. On the other hand, since the AND gates G0 to G2 output "0", the XOR gates X0 to X2 propagate the signals applied to the other input ends thereof without logic inversion and consequently the scan-in signal SI and the outputs of the flip flops 30 and 31 are given to the "1"-input ends of the selectors 10 to 12, respectively. In other words, the equivalent configuration of the circuit of FIG. 6 can be shown in FIG. 1 and the circuit of FIG. 6 performs the same operation as in the first preferred embodiment.

Figure 7:
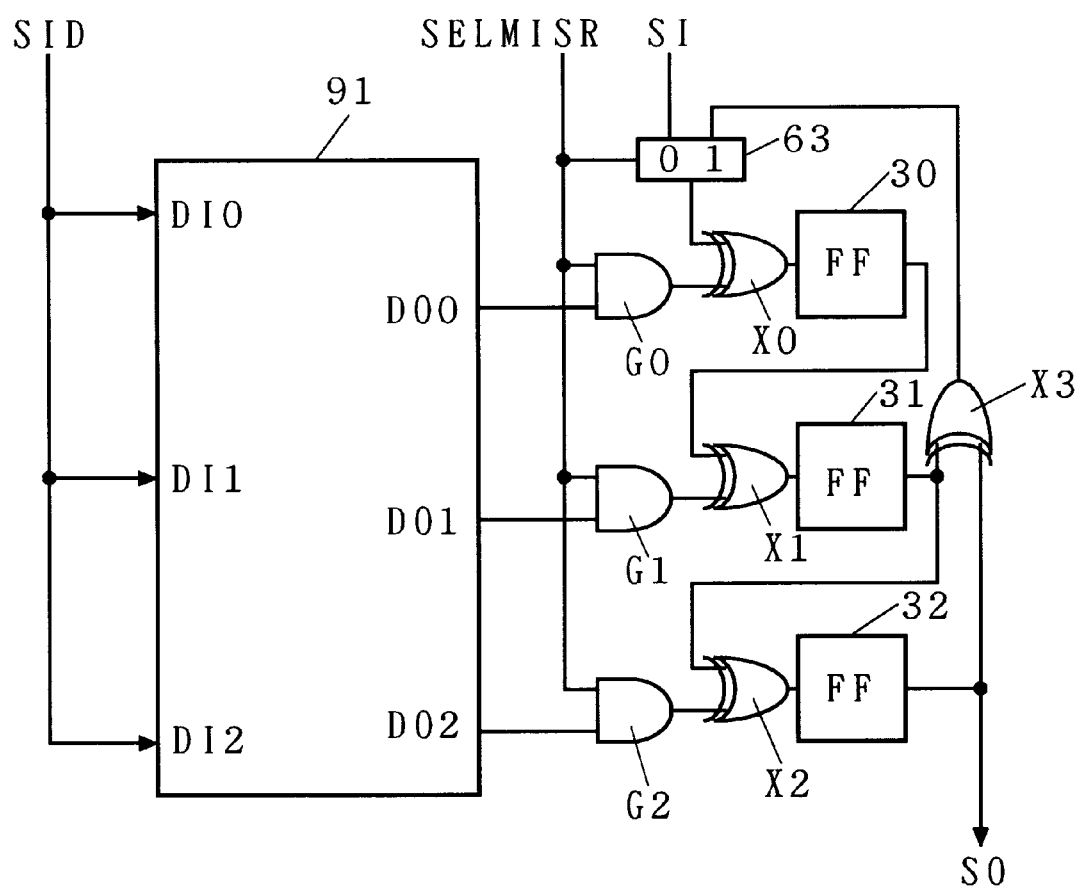
FIG. 7 is a circuit diagram showing an equivalent configuration of the circuit of FIG. 6 in the RAM test.

FIG. 7 is a circuit diagram showing an equivalent configuration of the circuit of FIG. 6 in the RAM test. When the RAM test is made, both the shift mode signal SM and the RAM test signal RAMTEST are set to "1". The test-mode signal TEST may take either "0" or "1". Since the selectors 50 to 52 are not related in function to the RAM test, the connections of the selectors 50 to 52 are omitted in FIG. 7.

Since the shift mode signal SM is "1", the outputs of the XOR gates X0 to X2 are given to the input ends of the flip flops 30 to 32, respectively. Moreover, since the RAM test signal RAMTEST is "1", the RAM test data SID are given to the input ends DI0 to DI2 of the RAM core 91.

Like the second preferred embodiment, the flip flops 30 to 32, which are used for writing data into the RAM core 91 in the normal operation, receive the outputs of the RAM core 91 and scan and output the test result read out from the RAM core 91 in the RAM test. Furthermore, the test result is shifted after completion of the test on all the addresses in the third preferred embodiment though the test result has to be shifted out for each address in the second preferred embodiment.

A specific process of the RAM test is as follows: ① The compression selection signal SELMISR is set to "0" and the scan-in signal SI is set to "0", for example. The flip flops 30 to 32 are thereby all initialized to "0". The operations until this step are shown in the column of "INITIALIZATION" of Table 3. ② The RAM test data SID is set to "0", for example, and "0" are written to all the addresses of the RAM core 91, while both the compression selection signal SELMISR and the scan-in signal SI remain "0". ③ The compression selection signal SELMISR is set to "1" to perform reading operation for all the addresses. The operations until this step are shown in the column of "TEST EXECUTION" of Table 3. The selector 63 propagates the output of the XOR gate X3 to the other input end of the XOR gate X0, and the AND gates G0 to G2 propagate the outputs of the RAM core 91 to the XOR gates X0 to X2, respectively. Thus, the XOR gates X0 to X3 and the flip flops 30 to 32 constitute MISR (Multi Input Signature Register) circuits. The data from the RAM core 91 are inputted to the MISR circuits and compressed.

④ The compression selection signal SELMISR is set to "0" again to obtain the test result being shifted as the scan-out signal SO (see the column of "RESULT OUTPUT" of Table 3).

Thus, according to the third preferred embodiment, the RAM test can be performed like in the second preferred embodiment, and moreover employment of the MISR circuits allows reduction in time required for the test through compression of the test result.

The Fourth Preferred Embodiment.

According to the fourth preferred embodiment, the circuit allows compression of the test result in the test on the RAM core 91, like in the third preferred embodiment.

Figure 8:
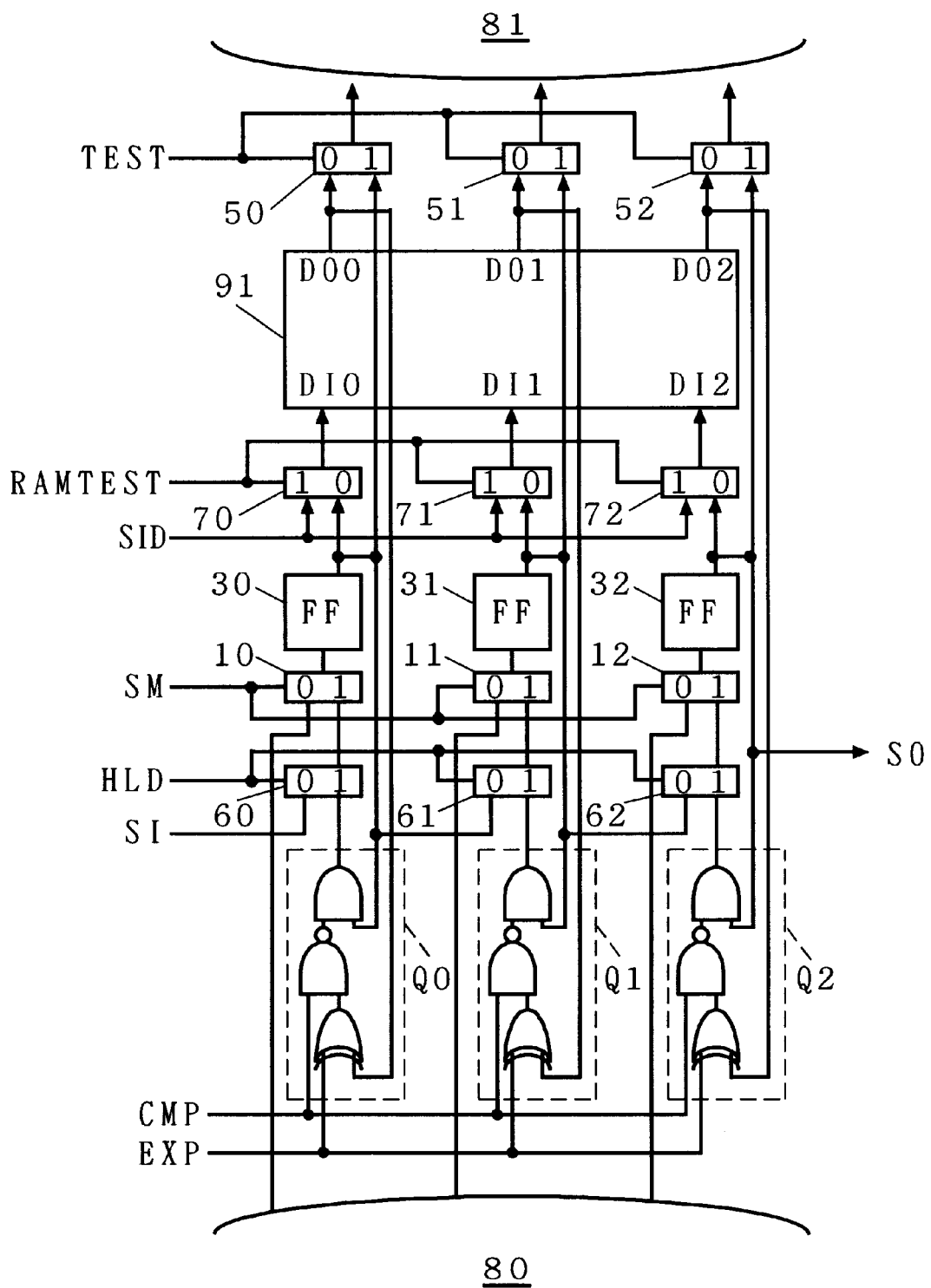
FIG. 8 is a circuit diagram showing a fourth preferred embodiment of the present invention.

FIG. 8 is a circuit diagram showing the fourth preferred embodiment of the present invention. A group of gates Q0 to Q2 are additionally provided to the circuit of the second preferred embodiment, and the output ends DO0 to DO2 of the RAM core 91 are connected to the "1"-input ends of the selectors 60 to 62 through the group of gates Q0 to Q2, respectively.

The group of gates Q0 to Q2 each receive an expectation signal EXP and a comparison control signal CMP. Moreover, the group of gates Q0 to Q2 receive the outputs of the flip flops 30 to 32 and output them to the "1"-input ends of the selectors 60 to 62, respectively.

The operations of the selectors 60 to 62 are controlled by a hold signal HLD in the fourth preferred embodiment though controlled by the output selection signal SELDO in the second preferred embodiment.

The expectation signal EXP, the comparison control signal CMP, the hold signal HLD and the RAM test data SID effectively perform their functions only in the RAM test and are supplied by the external tester or the built-in RAM self-test circuit in the execution of the RAM test.

Table 4 shows the relation between the signals in FIG. 8 and the operation modes.

TABLE 4

| | NORMAL OPERATION | LOGIC SCAN TEST | RAM TEST | |
|---|---|---|---|---|
| | | | INITIALIZATION & RESULT OUTPUT | TEST EXECUTION |
| SI | DC | SCAN: TEST DATA TEST: DC | DC | DC |
| TEST | 0 | 1 | DC | DC |
| SM | 0 | SCAN: 1 TEST: 0 | 1 | 1 |
| RAMTEST | 0 | 0 | 1 | 1 |
| EXP | DC | DC | DC | DC → EXPECTED VALUE |
| CMP | DC | DC | 0 | 0 → 1 |
| HLD | 0 | 0 | 0 | 1 |
| SID | DC | DC | DC | WRITE DATA |

DC: Don't Care

In the normal operation and the logic scan test, both the RAM test signal RAMTEST and the hold signal HLD are set to "0". The selectors 70 to 72 thereby give the outputs of the flip flops 30 to 32 to the input ends DI0 to DI2 of the RAM core 91, respectively, and the selector 60 applies the scan-in signal SI to the "1"-input end of the selector 10 and the selectors 61 and 62 give the outputs of the flip flops 30 and 31 to the "1"-input ends of the selectors 11 and 12, respectively. In other words, the equivalent configuration of the circuit of FIG. 8 can be shown in FIG. 1 and the circuit of FIG. 8 performs the same operation as in the first preferred embodiment.

Figure 9:
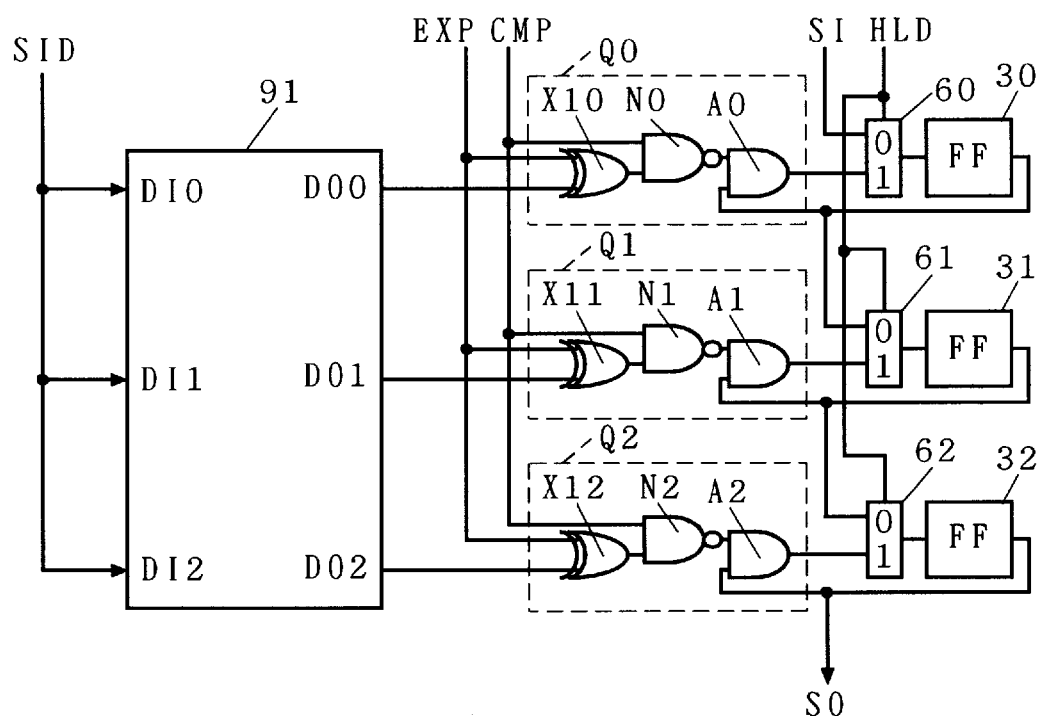
FIG. 9 is a circuit diagram showing an equivalent configuration of the circuit of FIG. 8 in the RAM test.

FIG. 9 is a circuit diagram showing an equivalent configuration of the circuit of FIG. 8 in the RAM test. When the RAM test is made, both the shift mode signal SM and the RAM test signal RAMTEST are set to "1". The test-mode signal TEST may take either "0" or "1". Since the selectors 50 to 52 are not related in function to the RAM test, the connections of the selectors 50 to 52 are omitted in FIG. 9.

Since the shift mode signal SM is "1", the outputs of the selectors 60 to 62 are given to the input ends of the flip flops 30 to 32, respectively. Moreover, since the RAM test signal RAMTEST is "1", the RAM test data SID are given to the input ends DI0 to DI2 of the RAM core 91.

The group of gates Qi (i=0 to 2) consists of an XOR gate X1i, a NAND gate Ni and an AND gate Ai. The output end DOi of the RAM core 91 is connected to one of the input ends of the XOR gate X1$i$ and the expectation signal EXP is applied to the other input end thereof. An output of the XOR gate X1i and the comparison control signal CMP are given to a pair of input ends of the NAND gate Ni. An output of the NAND gate Ni and the output of the flip flop 3$i$ are given to a pair of input ends of the AND gate Ai and an output of the AND gate Ai is given to the "1"-input end of the selector 6$i$.

Thus, in the fourth preferred embodiment, the compression circuit consisting of the group of gates Q1, the selector 6$i$ and the flip flop 3$i$ is provided independently for each output end DOi of the RAM 91. This configuration is useful to specify the fault location from the test result.

A specific process of the RAM test is as follows: ① The hold signal HLD is set to "0" to make a path in which the selectors 60 to 62 and the flip flops 30 to 32 are alternately connected in series. Then, the scan-in signal SI is set to "1", for example, to initialize all the flip flops 30 to 32 to "1". The operations until this step are shown in the column of "INITIALIZATION" of Table 4. ② The hold signal HLD is set to "1" to make a loop consisting of the AND gate Ai, the selector 6$i$ and the flip flop 3$i$. At this time, by setting the comparison control signal CMP to "0", the NAND gate Ni always outputs "1" and the logic of the flip flop 3$i$ is held. On the other hand, write data (for example, "0") are given as the RAM test data SID and "0" is written into all the addresses of the RAM core 91. ③ 1 The comparison control signal CMP is set to "1" while the hold signal HLD remains "1". Expected value "0" has been given to the expectation signal EXP until then, and a reading operation starts for the RAM core 91.

With respect to the output end DO0, for example, the data read out thereto are compared with the expectation signal EXP (which has an expected value "0") in the XOR gate X10 and judged whether both are equal or not. The comparison result is inverted by the NAND gate N0 and then given to the AND gate A0. If the read data at the output end DO0 is equal to the expected value "0", the AND gate A0 gives the same logic "1" as stored in the flip flop 30 to the selector 60 and accordingly the value of the flip flop 30 remains "1".

On the other hand, if the read data is not equal to the expected value, the AND gate A0 always outputs "0". Therefore, once a fault is found at the output end DO0, "0" is stored into the flip flop 30. The same is applied to the other output ends DO1 and DO2. The operations until this step are shown in the column of "TEST EXECUTION" of Table 4.

④ The hold signal HLD is set to "0" and the comparison control signal CMP is set to "0", to obtain the values which are stored in the flip flops 30 to 32 during the test execution, being shifted as the scan-out signal SO while maintaining their logics. Then, "1" is detected at a normal bit and "0" is detected at a faulty bit (see the column of "RESULT OUTPUT" of Table 4).

Thus, the fourth preferred embodiment further produces an effect of specifying the fault location since the test result is compressed on each bit.

The Fifth Preferred Embodiment.

With modification of the configurations in accordance with the first to fourth preferred embodiments, the present invention may be applied to a RAM in which the number of writing ports is smaller than the number of reading ports.

Figure 10:
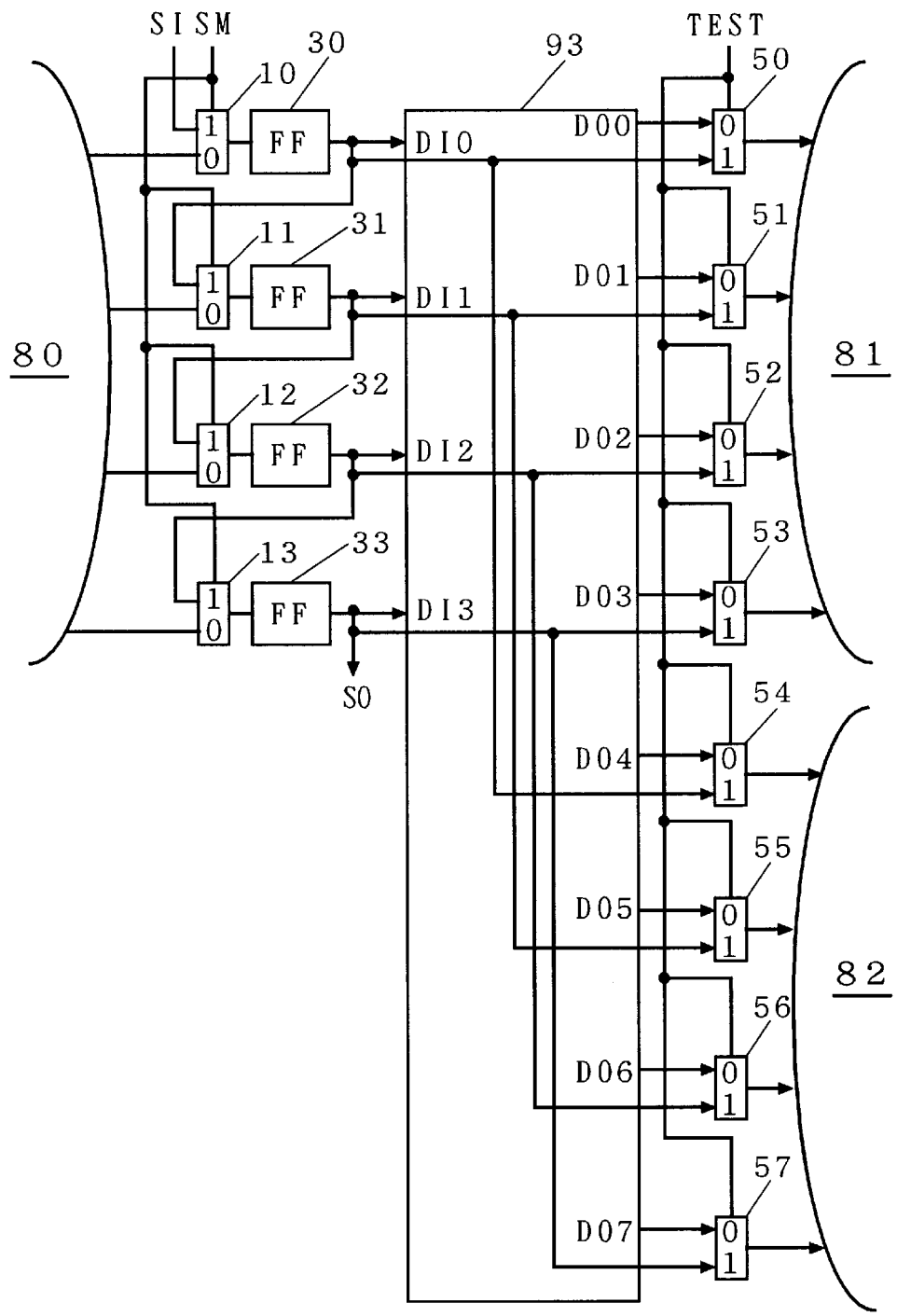
FIG. 10 is a circuit diagram showing a fifth preferred embodiment of the present invention.

FIG. 10 is a circuit diagram showing the fifth preferred embodiment of the present invention. A RAM core 93 includes a group of writing ports (input ends) DI0 to DI3 and the first group of reading ports (output ends) DO0 to DO3 and the second group of reading ports (output ends) DO4 to DO7, and is so called "1"-write 2-read RAM (1 w 2 r RAM).

If the circuit in accordance with any of the first to fourth preferred embodiments is applied to the RAM 93 in which the number of output ends is larger than the number of input ends to give a signal to a logic unit connected to the output ends, the circuit is short of flip flops for writing. Specifically, the operation in accordance with any of the first to fourth preferred embodiments can be performed only for either the first group of reading ports DO0 to DO3 or the second group of reading ports DO4 to DO7.

FIG. 10 shows a modified configuration of the first preferred embodiment. The output of the logic unit 80 is given to the "0"-input end of the selector 1$j$ (j=0 to 3) and the output of the selector 1$j$ is given to the input end of the flip flop 3$j$. The scan-in signal SI is applied to the "1"-input end of the selector 10 and the outputs of the flip flops 30 to 32 are given to the "1"-input ends of the selectors 11 to 13, respectively. The operation of the selector 1$j$ is controlled by the shift mode signal SM.

The output of the flip flop 3$j$ is given to the input end DI$j$ of the RAM core 93 and further to the "1"-input ends of the selectors 5$j$ and 5($j$+4). Operations of the selectors 5$j$ and 5($j$+4) are controlled by the test-mode signal TEST and the output ends DO$j$ and DO($j$+4) of the RAM core 93 are connected to the "0"-input ends of the selectors 5$j$ and 5($j$+4). The outputs of the selectors 50 to 53 are given to the logic unit 81 and outputs of selectors 54 to 57 are given to a logic unit 82.

Figure 11:
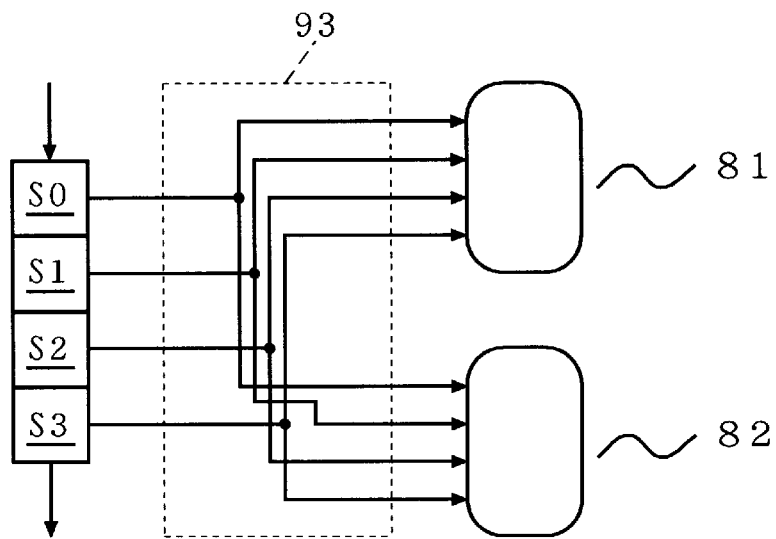
FIG. 11 is a circuit diagram showing an equivalent configuration of the circuit of FIG. 10 in the logic scan test.

FIG. 11 is a circuit diagram showing an equivalent configuration of the circuit of FIG. 10 in the logic scan test. Since the test-mode signal TEST is "1", the selectors 50 to 57 are omitted in this figure. The pair of the selector 1$j$ and the flip flop 3$j$ is abbreviated to a scan flip flop 5$j$.

Thus, in the fifth preferred embodiment, the same test pattern in the logic test is given to the logic unit 81 connected to the first group of reading ports DO0 to DO3 and the logic unit 82 connected to the second group of reading ports DO4 to DO7, and therefore the same effect as in the first preferred embodiment is achieved in a case of the RAM in which the number of writing ports is smaller than the number of reading ports.

Naturally, the modification in accordance with the fifth preferred embodiment can be applied to the circuits of the second to fourth preferred embodiments. Specifically, the "1"-input ends of the selectors 5$k$, 5($k$+$m$), . . . 5($k$+$nm$) have only to be connected in common to the output end of the flip flop 3$k$ ($0 \leq k \leq m-1$, n: the ratio of the number of reading ports to the number of writing ports−1).

The fifth preferred embodiment produces an effect of reducing an area by that for the scan flip flops conventionally used for the reading ports.

The Sixth Preferred Embodiment.

The fifth preferred embodiment achieves an effective logic test when the respective data to be inputted to the logic units 81 and 82 are processed independently of each other, but is not suitable otherwise, for example, in a case where the logic units 81 and 82 are integrated to obtain a sum of the respective data to be inputted thereto. That is because the same value is given to the respective data.

Figure 12:
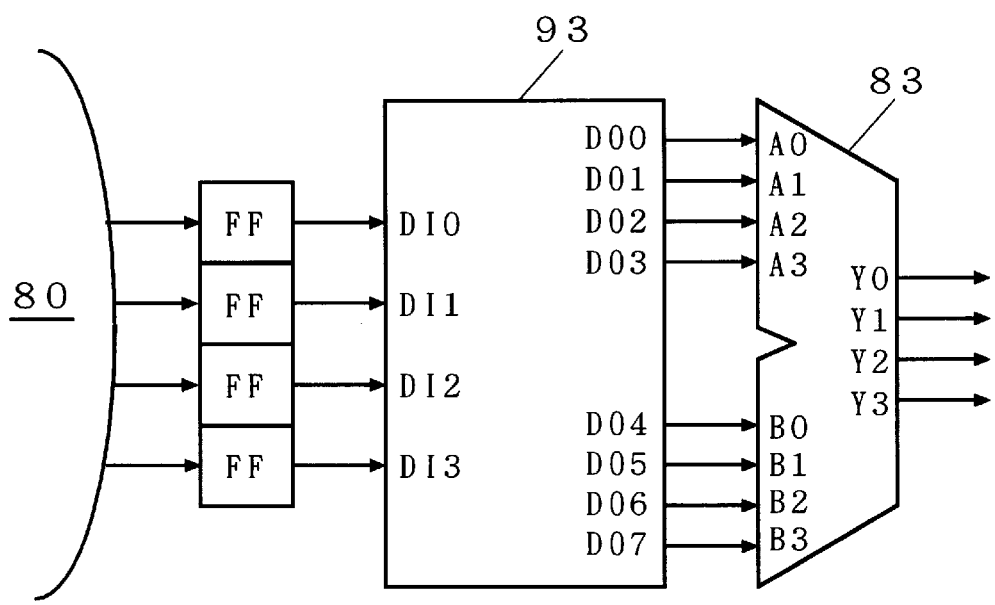
FIG. 12 is a circuit diagram showing a configuration to obtain an addition result by using an ALU 83.

FIG. 12 is a circuit diagram showing a configuration to obtain a sum of the outputs of the first group of reading ports DO0 to DO3 and the second group of reading ports DO4 to DO7 by using an ALU 83. The outputs of the first group of reading ports DO0 to DO3 are given to the first group of input ends A0 to A3 and the outputs of the second group of reading ports DO4 to DO7 are given to the second group of input ends B0 to B3 and sums Y0 to Y3 are outputted.

Figure 13:
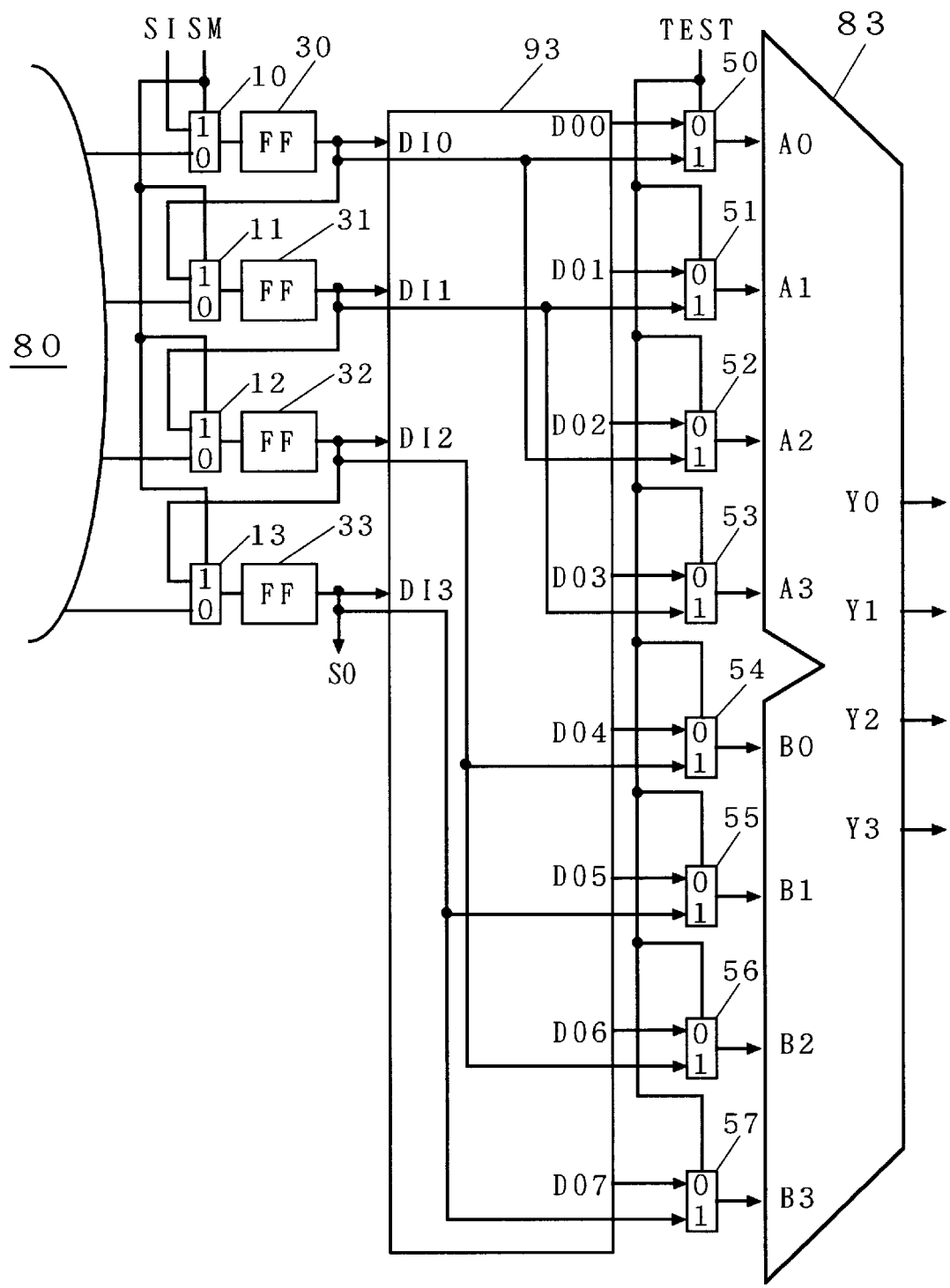
FIG. 13 is a circuit diagram showing an example of a sixth preferred embodiment of the present invention.

FIG. 13 is a circuit diagram showing an example of the sixth preferred embodiment of the present invention. The output of the flip flop 30 is given to the "1"-input ends of the selectors 50 and 52, the output of the flip flop 31 is given to the "1"-input ends of the selectors 51 and 53, the output of the flip flop 32 is given to the "1"-input ends of the selectors 54 and 56, and the output of the flip flop 33 is given to the "1"-input ends of the selectors 55 and 57. The output ends of the selectors 50 to 53 and the output ends of the selectors 54 to 57 are connected to the first group of input ends A0 to A3 and the second group of input ends B0 to B3 of the ALU 83, respectively.

Figure 14:
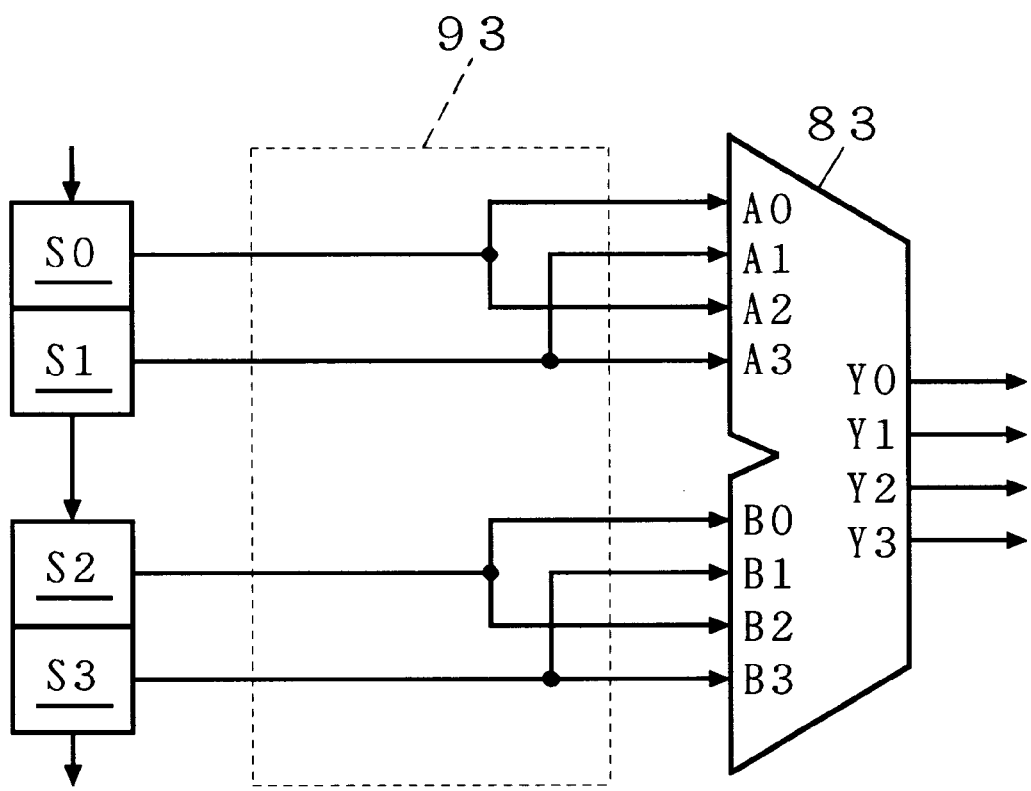
FIG. 14 is a circuit diagram showing an equivalent configuration of the circuit of FIG. 13 in the logic scan test.

FIG. 14 is a circuit diagram showing an equivalent configuration of the circuit of FIG. 13 in the logic scan test. Since the test-mode signal TEST is "1", the selectors 50 to 57 are omitted in this figure. The pair of selector 1*j* and the flip flop 3*j* are abbreviated to the scan flip flop S*j*.

The scan flip flops S0 and S1 give a group of test data to the first group of input ends A0 to A3 and the scan flip flops S2 and S3 give a group of test data to the second group of input ends B0 to B3, and these two groups of test data are independent of each other. Therefore, it is possible to effectively perform a test on the ALU 83 which calculates the sum of the two groups of test data.

Specifically discussing, the flip flops for writing 30 to 33 are allocated to two groups, the flip flops 30 and 31 and the flip flops 32 and 33, so as to be separately used for each group of reading ports. The outputs of the flip flops for writing to be used for each group of reading ports are double used at the group of reading ports. Thus, the test on the ALU 83, which is a logic unit for processing a plurality of data that are read out from a plurality of groups of reading ports and are not processed independently of each other, can be effectively performed.

There may be a configuration to double use the outputs of the flip flops for writing at each group of reading ports other than that of FIG. 13.

Figure 15:
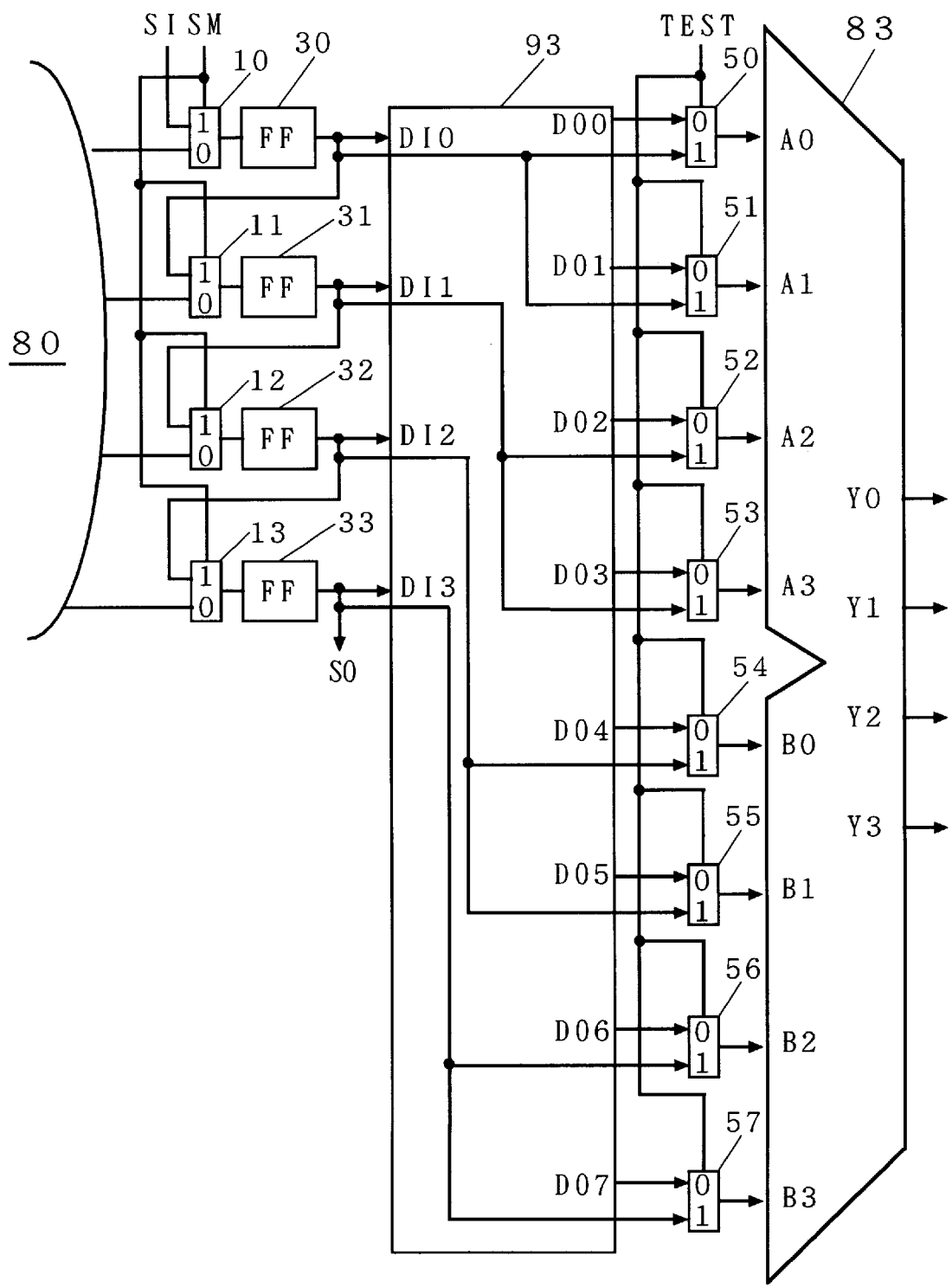
FIG. 15 is a circuit diagram showing another example of the sixth preferred embodiment of the present invention.

FIG. 15 is a circuit diagram showing another example of the sixth preferred embodiment of the present invention. A modified configuration of the first preferred embodiment is shown in this figure. The output of the flip flop 30 is given to the "1"-input ends of the selectors 50 and 51, the output of the flip flop 31 is given to the "1"-input ends of the selectors 52 and 53, the output of the flip flop 32 is given to the "1"-input ends of the selectors 54 and 55 and the output of the flip flop 33 is given to the "1"-input ends of the selectors 56 and 57.

Figure 16:
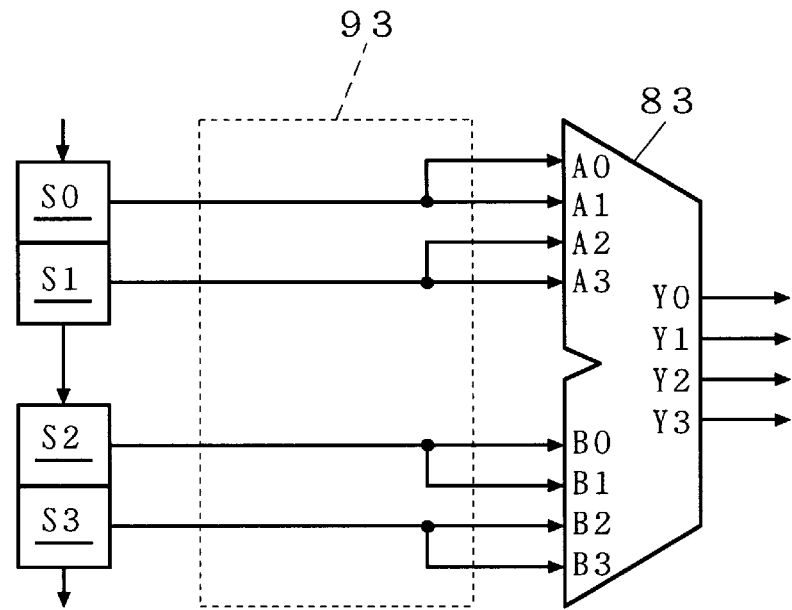
FIG. 16 is a circuit diagram showing an equivalent configuration of the circuit of FIG. 15 in the logic scan test.

FIG. 16 is a circuit diagram showing an equivalent configuration of the circuit of FIG. 15 in the logic scan test. This configuration can naturally produce the same effect as that of FIG. 13.

The same modification as shown in the sixth preferred embodiment may be applied to the second to fourth preferred embodiments. With this modification, the second to fourth preferred embodiments allow reduction in area by that required for the scan flip flops conventionally used for the group of reading ports.

Furthermore, since the outputs of the flip flops are double used for one group of reading ports, a fault coverage on the ALU 83 is not considered enough high. Inserting a selector for achieving both the circuits of FIGS. 13 and 15 to perform two separate tests is one of resolutions of this problem.

The Seventh Preferred Embodiment.

As the first to fourth preferred embodiments, the RAM which performs a writing operation in a synchronous mode has been discussed. A RAM which performs a reading operation in the synchronous mode in accordance with the present invention can be achieved.

Figure 17:
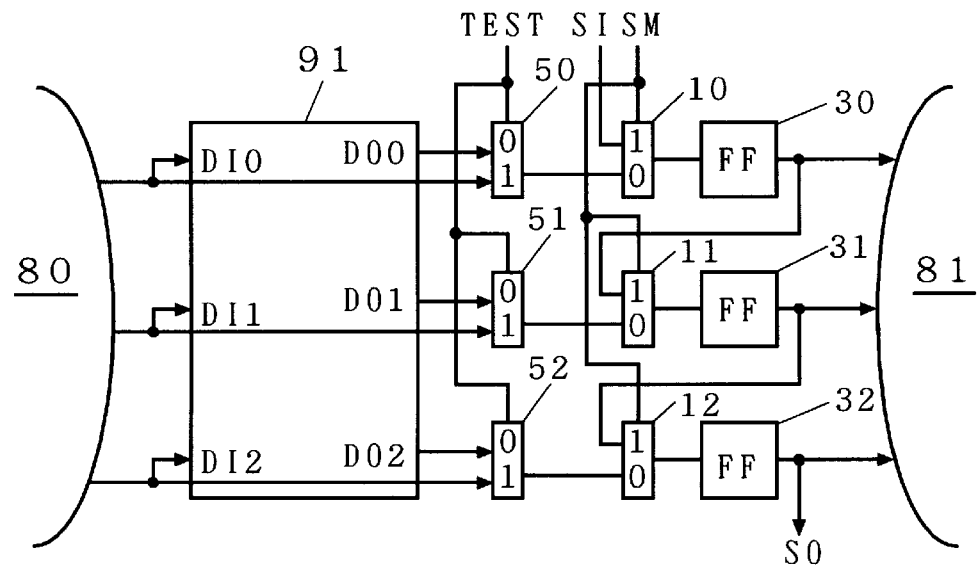
FIG. 17 is a circuit diagram showing a seventh preferred embodiment of the present invention.

FIG. 17 shows a case where the circuit of FIG. 1 in accordance with the first preferred embodiment is applied to the RAM which performs a synchronous reading operation. Like FIG. 1, the output ends DO0 to DO2 and the input ends D10 to D12 of the RAM core 91 are connected to the "0"-input ends and the "1"-input ends of the selectors 50 to 52, respectively.

In the circuit of FIG. 17, the outputs of the logic unit 80 are directly given to the input ends D10 to D12 of the RAM core 91, unlike the circuit of FIG. 1. The outputs of the selectors 50 to 52 are given to the "0"-input ends of the selectors 10 to 12, respectively.

The connection between the selectors 10 to 12 and the flip flops 30 to 32 is the same as that of FIG. 1. The outputs of the flip flops 30 to 32 are given to the logic unit 81.

Figure 18:
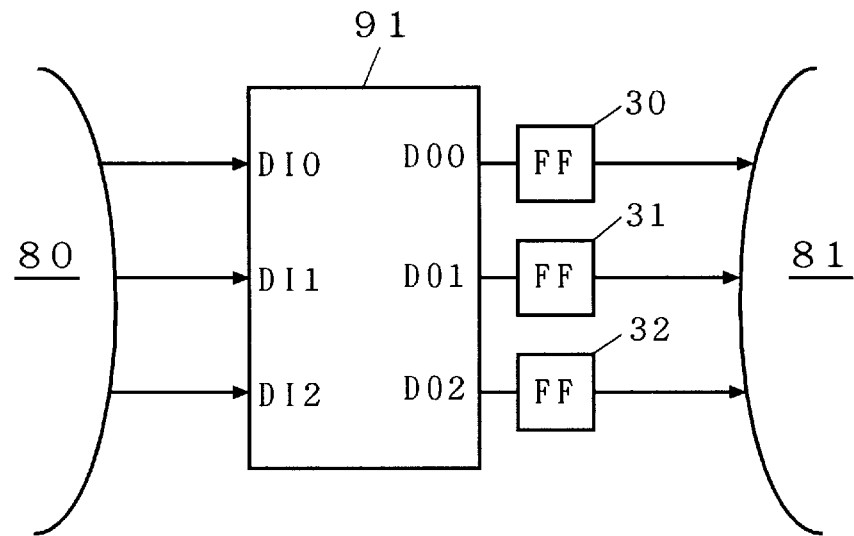
FIG. 18 is a circuit diagram showing an equivalent configuration of the circuit of FIG. 17 in the normal operation.

In the seventh preferred embodiment, the operation is performed on the basis of Table 1. FIG. 18 is a circuit diagram showing an equivalent configuration of the circuit of FIG. 17 in the normal operation. By setting both the test-mode signal TEST and the shift mode signal SM to "0", the outputs of the logic unit 80 are directly inputted to the RAM core 91 and the outputs of the RAM core 91 are given to the logic unit 81 through the flip flops 30 to 32. Thus, the circuit of FIG. 1 performs the asynchronous writing and the synchronous reading in the normal operation.

Figure 19:
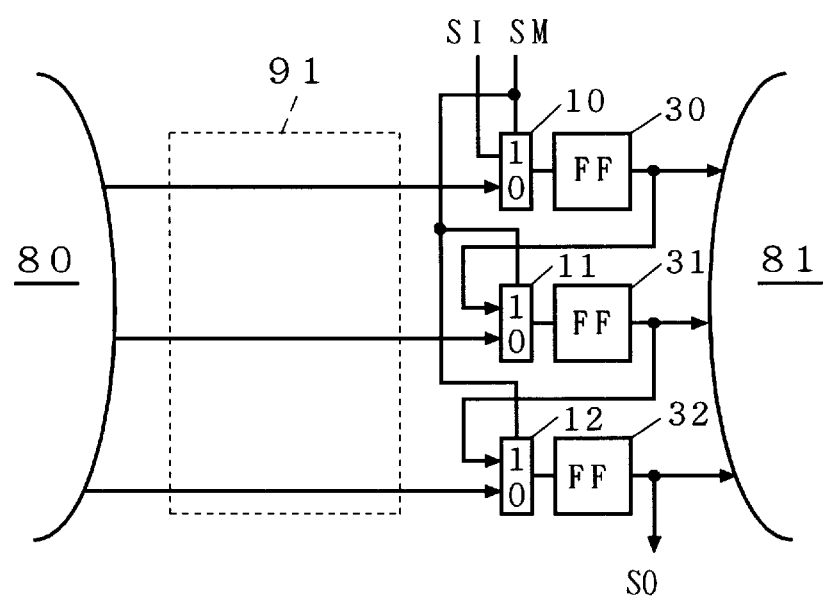
FIG. 19 is a circuit diagram showing an equivalent configuration of the circuit of FIG. 17 in the logic scan test.
Figure 20:
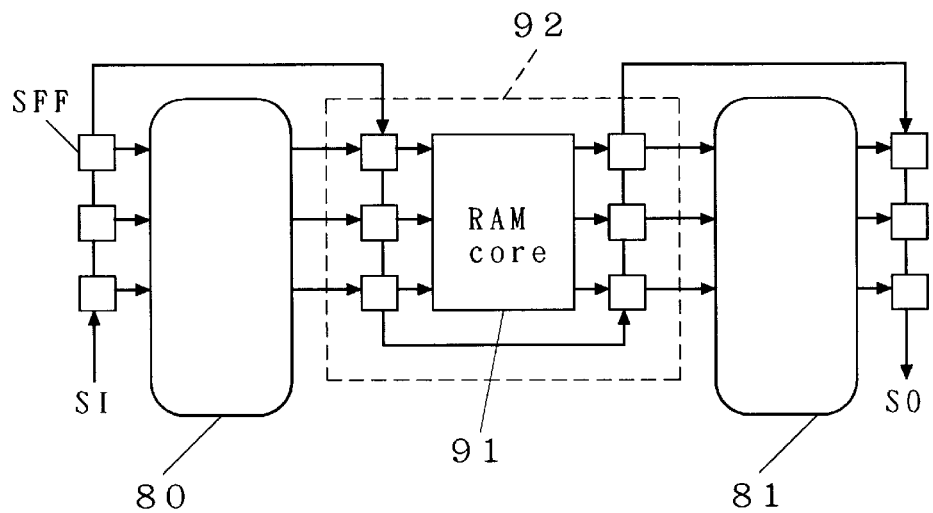
FIG. 20 is a block diagram showing a test method on a RAM using a scan test system in a background art.
Figure 21:
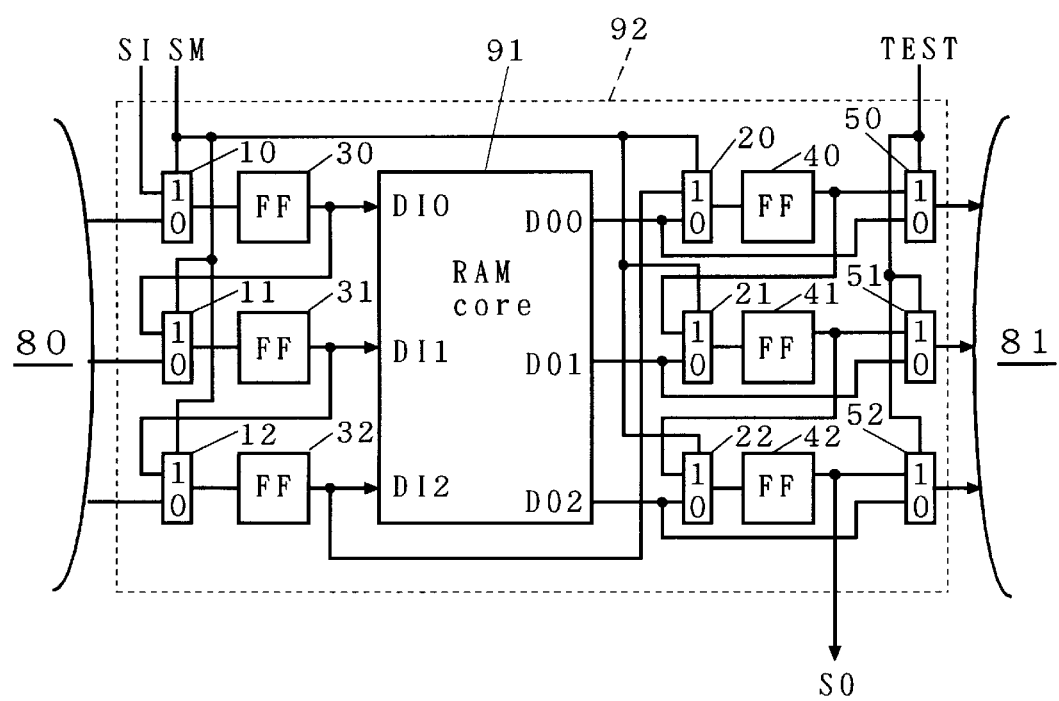
FIG. 21 is a circuit diagram showing a configuration of a scan path in the periphery of a RAM 91 in detail.

FIG. 19 is a circuit diagram showing an equivalent configuration of the circuit of FIG. 17 in the logic scan test. The test-mode signal TEST is set to "1"to achieve the same configuration as that of FIG. 3, and thereby the scan test can be performed on the logic units 80 and 81.

Naturally, the configuration of the second to fourth preferred embodiments to perform the RAM test may be provided between the selectors 50 to 52 and the logic unit 81, and thereby the RAM test can be performed and further the test result can be compressed.

Variation

The scan flip flop consisting of a selector which receives the normal data and the scan signal and a flip flop which receives the output of the selector has been discussed as the first to seventh preferred embodiments.

A scan flip flop which receives the normal data and the scan signal and includes a clock for normal operation and a scan clock, for example, instead of the above scan flip flop, also produces the same effect as in the first to seventh preferred embodiments.

A shift register latch used for LSSD (Level Sensitive Scan Design), for example, instead of the above scan flip flop, also produces the same effect as in the first to seventh preferred embodiments.

While the invention has been shown and described in detail, the foregoing description is in all aspects illustrative and not restrictive. It is therefore understood that numerous modifications and variations can be devised without departing from the scope of the invention.

We claim:

1. A test circuit provided between first and second circuits for performing a first test on said first and second circuits, comprising:

a third circuit having a plurality of inputs connected to said first circuit and a plurality of outputs;

a scan path having a plurality of inputs connected to said first circuit, a plurality of outputs connected to said plurality of third circuit inputs, a scan input terminal and a scan output terminal, for propagating a scan signal between said scan input terminal and said scan output terminal; and first selecting means for selectively connecting either said plurality of third circuit outputs or said plurality of scan path outputs to said second circuit.

2. The test circuit of claim 1, wherein said scan path circuit consists of a plurality of scan flip flops, each having a flip flop; and a selector having a first input connected to said first circuit, being a constituent of said plurality of scan path circuit inputs, a second input to which said scan signal is propagated and an output for selectively outputting either of signals applied to said first and second selector inputs to said flip flop, and wherein an output of said flip flop of one of said plurality of scan flip flops is given to said second selector input of said selector of another one of said plurality of scan flip flops to establish a series connection of said plurality of scan flip flops to one another between said scan input terminal and said scan output terminal.

3. The test circuit of claim 1, further comprising:

second selecting means for selectively outputting either signals applied to said plurality of scan path circuit outputs or test data which are received in execution of a second test on said third circuit to said third circuit.

4. The test circuit of claim 3, wherein said scan path circuit consists of a plurality of scan flip flops, each having a first input terminal connected to said first circuit, being a constituent of said plurality of scan path circuit inputs;

a second input terminal to which said scan signal is propagated;

a third input terminal for receiving an output of said third circuit; and an output terminal being a constituent of said plurality of scan path circuit outputs, and each selectively holding one of data applied to said first to third input terminals and outputting said one of data to said output terminal.

5. The test circuit of claim 4, wherein each of said plurality of scan flip flops further has a flip flop for outputting said one of data to said output terminal;

a first selector having a first input connected to said first input terminal, a second input and an output for selectively outputting either of signals applied to said first input and said second input of said first selector to said further flip flop; and a second selector having a first input, a second input provided with an output of said third circuit, and an output end for selectively outputting either of signals applied to said first and second input of said second selector to said second input of said first selector, and wherein said output terminal of one of said plurality of scan flip flops is connected to said first input of said second selector of another one of said plurality of scan flip flops to establish a series connection of said plurality of scan flip flops to one another between said scan input terminal and said scan output terminal.

6. The test circuit of claim 3, wherein said scan path circuit includes a plurality of scan flip flops, each having a first input terminal connected to said first circuit, being a constituent of said plurality of scan path circuit inputs;

a second input terminal; and an output terminal being a constituent of said plurality of scan path circuit outputs, and each selectively holding one of data applied to said first and second input terminals and outputting said one of data to said output terminal; and a logic circuit for receiving an output signal of said third circuit and said scan signal, and wherein said logic circuit propagates said scan signal to said second input terminal of each of said plurality of scan flip flops in a first case, and said logic circuit and said plurality of scan flip flops constitute a MISR circuit to process said output signal of said third circuit in a second case.

7. The test circuit of claim 6, wherein each of said plurality of scan flip flops further includes a flip flop; and a first selector having a first input connected to said first input terminal, a second input connected to said second terminal and an output for selectively outputting either of signals applied to said first and second inputs of said first selector to said flip flop; and said logic circuit includes first logic gates provided which correspond to said plurality of scan flip flops, each having a first input for receiving a control signal which takes a first value in said first case and takes a second value in said second case;

a second input being a constituent of said plurality of third circuit outputs, for receiving said output signal of said third circuit corresponding to said first selector; and an output for outputting a value only on the basis of said control signal when said control signal takes said first value and outputting a value only on the basis of said output signal of said third circuit when said control signal takes said second value, and second logic gates provided which correspond to said plurality of scan flip flops, each having a first input connected to said output of each of said first logic gates;

a second input; and an output connected to said second input of said first selector, for inverting/non-inverting a value applied to said second input of each of said second logic gates according to an output of each of said first logic gates, and wherein said scan signal travels through said second input of each of said second logic gates, said second input of each of said first selector and said flip flop.

8. The test circuit of claim 7, wherein said logic circuit further includes a third logic gate for taking an exclusive logic sum of a plurality of output signals from said flip flop; and a second selector for selectively giving either a scan-in signal applied to said scan path circuit or an output of said third logic gate to said second input of one of said second logic gates depending on whether said control signal takes said first value or said second value.

9. The test circuit of claim 8, wherein each of said first logic gates and each of said second logic gates are an AND gate and an XOR gate, respectively.

10. The test circuit of claim 3, wherein said scan path circuit includes
  a plurality of scan flip flops, each having a first input terminal connected to said first circuit, being a constituent of said plurality of scan path circuit inputs;
  a second input terminal to which said scan signal is propagated; and
  an output terminal being a constituent of said plurality of scan path circuits outputs, and
  each selectively holding one of data applied to said first and second input terminals and outputting said one of data to said output terminal, and
  first selectors provided which correspond to said plurality of scan flip flops, each having an output connected to said second input terminal, a first input and a second input which are selectively connected to said output of each of said first selectors; and
  logic circuits provided which correspond to said plurality of scan flip flops, each receiving an output of said third circuit and outputting said output of said third circuit to said second input of each of said first selectors,
  and wherein said scan signal is propagated to said first input of each of said first selectors, and
  each of said logic circuits and each of said first selectors form a loop to hold an output of the corresponding one of said plurality of scan flip flops and give a predetermined logic to said corresponding one of said plurality of scan flip flops if a result of said second test is faulty.

11. The test circuit of claim 10, wherein each of said logic circuits has
  an XOR gate including a first input given said output signal of said third circuit, a second input given an expected value for said second test and an output; and
  an AND gate including a first input connected to said XOR gate output, a second input receiving an output of said corresponding one of said plurality of scan flip flops and an output connected to said first input of each of said first selectors.

12. The test circuit of claim 11, wherein each of said logic circuits has
  a NAND gate including a first input receiving a control signal, a second input connected to said XOR gate output and an output connected to said first AND gate input.

13. The test circuit of claim 1, wherein
  a first number of outputs constituting said plurality of third circuit outputs is larger than a second number of input constituting said plurality of third circuit inputs.
  said first selecting means consists of selectors provided which correspond to said third circuit outputs, and
  a plurality of said selectors are connected to one of the outputs constituting said scan path circuit outputs.

14. The test circuit of claim 13, wherein
  said first number of said outputs of said third circuit is integer times as large as said second number of said inputs of said third circuit,
  said outputs of said third circuit are allocated to a plurality of groups by said second number of said inputs of said third circuit, and
  said selectors corresponding to said output ends of said third circuit which are each allocated to different groups are connected to the same output end of said scan path circuit.

15. The test circuit of claim 13, wherein
  said output ends of said third circuit are allocated to a plurality of groups,
  said output ends of said scan path are also allocated to a plurality of groups,
and
  a plurality of said output ends of said third circuit allocated to one of said plurality of groups are connected to one of said output ends of said scan path corresponding to said one of said plurality of groups.

* * * * *